United States Patent [19]
Suzuki et al.

[11] Patent Number: 5,427,890
[45] Date of Patent: Jun. 27, 1995

[54] PHOTO-SENSITIVE LAMINATE FILM FOR USE IN MAKING THE MASK COMPRISING A SUPPORTING SHEET, AN IMAGE MASK PROTECTION LAYER WHICH IS WATER INSOLUBLE AND A WATER SOLUBLE IMAGE MASK FORMING COMPOSITION

[75] Inventors: Tsutomu Suzuki; Ikuo Suzuki, both of Toyohashi, Japan

[73] Assignee: Aicello Chemical Co., Ltd., Japan

[21] Appl. No.: 116,277

[22] PCT Filed: Oct. 22, 1990

[86] PCT No.: PCT/JP90/01360

§ 371 Date: Mar. 28, 1991

§ 102(e) Date: Mar. 28, 1991

Related U.S. Application Data

[63] Continuation of Ser. No. 668,520, Mar. 28, 1991, abandoned.

[51] Int. Cl.$^6$ .................. G03C 1/805; G03C 1/91; G03F 7/021; G03F 7/012
[52] U.S. Cl. ................... 430/263; 430/160; 430/167; 430/262; 430/271; 430/286; 430/287; 430/909
[58] Field of Search ............... 430/160, 167, 271, 260, 430/198, 14, 18, 311, 312, 310, 262, 263, 909, 286, 287

[56] References Cited

U.S. PATENT DOCUMENTS

| | | | |
|---|---|---|---|
| 3,808,751 | 5/1974 | Usui | 430/396 |
| 4,268,601 | 5/1981 | Namiki et al. | 430/263 |
| 4,272,620 | 9/1981 | Ichimura | 430/287 |
| 4,430,416 | 2/1984 | Goto et al. | 430/263 |
| 4,444,868 | 4/1984 | Ichimura | 430/287 |
| 4,530,896 | 7/1985 | Christensen et al. | 430/160 |
| 4,587,186 | 5/1986 | Nakamura et al. | 430/14 |
| 4,764,449 | 8/1988 | VanIseghem | 430/271 |
| 4,985,344 | 1/1991 | Uchino et al. | 430/160 |
| 5,057,394 | 10/1991 | Yabe et al. | 430/167 |
| 5,158,857 | 10/1992 | Shinozaki et al. | 430/262 |

FOREIGN PATENT DOCUMENTS 58-196971 11/1983 Japan.
60-104938 6/1985 Japan.
60-104939 6/1985 Japan.

OTHER PUBLICATIONS

Patent Abstracts of Japan, vol. 010, No. 364, Dec. 5, 1986 & JP A 61 160 748.
Patent Abstracts of Japan, vol. 007, No. 286, Dec. 21, 1983 & JP A 58 159 530.

*Primary Examiner*—Charles L. Bowers, Jr.
*Assistant Examiner*—John S. Chu
*Attorney, Agent, or Firm*—Parkhurst, Wendel & Rossi

[57] ABSTRACT

A method for engraving and/or etching comprising the steps of: (a) a process for exposing, to light, a layer of a water-soluble resin composition of a laminated photo-sensitive film which comprises a supporting sheet, a image mask-protection layer peelablly adhered to the supporting sheet and a layer of a water-soluble resin composition having photocrosslinkability to thus cause crosslinking of the exposed area of the resin layer to thereby form a predetermined pattern on the resin layer; (b) a process for dissolving out the non-crosslinked portion of the layer of the water-soluble photo-sensitive resin composition by developing the layer with water to thus from an image-carrying mask which is constituted from the crosslinked area of the photo-sensitive resin composition remaining on the image mask-protection layer; (c) a process for adhering the photo-sensitive laminate film on which the images are formed to the surface of a material to be processed; (d) a process for peeling off the supporting sheet from the photo-sensitive laminate film; and (e) a process for engraving and-/or etching the material to be processed through the image-carrying mask adhered to the material, makes it possible to engrave and/or etch fine and precises images on the surface of a material to be processed such as glass, metals, plastics or the like.

4 Claims, 3 Drawing Sheets

PHOTO-SENSITIVE LAMINATE FILM FOR USE IN MAKING THE MASK COMPRISING A SUPPORTING SHEET, AN IMAGE MASK PROTECTION LAYER WHICH IS WATER INSOLUBLE AND A WATER SOLUBLE IMAGE MASK FORMING COMPOSITION

This is a continuation of application Ser. No. 07/668,520 filed Mar. 28, 1991, now abandoned.

DESCRIPTION

1. Technical Field

The present invention relates to a method for forming images by engraving through sand blasting or by etching with chemicals, for instance, solutions of etching agents through an image-carrying mask such as picture images, patterns or letters on the surface of materials to be processed such as glass, stone, pottery, metals, plastics, wooden materials and leather as well as a photo-sensitive laminate film for use in making such an image-carrying mask.

2. Background Art

Conventionally known methods for processing the surface of a material such as glass, a metal or a plastic by engraving images on the surface comprise the steps of first forming a resist layer, in the form of images, on the surface of a material to be processed and then subjecting the entire surface inclusive of the surface of the resist layer to sand blasting to thus engrave the surface on which any image is not present and to thereby form the images thereon. When the material to be processed is glass, a treatment of the surface with hydrofluoric acid can be substituted for the sand blasting treatment and thus desired images can be formed on the surface through engraving and/or etching of the surface portion on which any image is not present. On the other hand, when the material to be processed is a copper plate, the surface can also be treated with an aqueous solution of ferric chloride and thus the desired images can be formed through engraving and/or etching of the surface portion on which any image is not present.

The formation of a resist layer can be performed according to a method which comprises printing desired images on the surface of a material to be processed with a resist ink according to the screen printing method to thus form a resist layer in the form of desired images. Alternatively, a resist layer can also be formed by likewise printing images on the surface of a nonwoven fabric of glass fibers according to the screen printing method and then adhering the resulting nonwoven fabric carrying the printed images to the surface of a material to be processed.

Moreover, there have been proposed a variety of methods for preparing image-carrying masks using liquid photo-sensitive resins. For instance, Japanese Patent Publication for Opposition Purpose (hereunder referred to as "J. P. KOKOKU") No. Sho 46-35681 discloses a method for producing an image carrying mask which comprises the steps of enclosing a predetermined surface area of a material to be processed such as glass with a rubber frame, directly pouring a photo-sensitive resin into the enclosed area, covering the area with a cellophane film, exposing the resin to light through a negative film carrying pictures and/or patterns, peeling off the cellophane film and then developing the imagewise exposed photo-sensitive resin to thus form a resist layer carrying the desired images.

Japanese Patent Unexamined publication (hereunder referred to as "J. P. KOKAI") No. Sho 53-99258 discloses a method for producing an image-carrying mask which comprises sandwiching a liquid photo-sensitive resin composition between two transparent films to form a photo-sensitive resin composition between two transparent films to form a photo-sensitive layer, exposing the liquid photo-sensitive resin layer to light while bringing the composition in close contact with a photomask carrying desired pictures and/or patterns, peeling off the transparent film on the side of the photomask, removing the unexposed areas of the layer to thus give the desired image, adhering the resulting photo-sensitive resin layer on which the images are thus formed to the surface of a material to be processed so that the face of the former on the photomask side opposes the surface of the material and peeling off the remaining transparent film.

J. P. KOKAI No. Sho 55-96270 discloses a method which comprises the steps of putting a molding frame which also serves as a spacer on a support layer (for instance, a polyester film having a thickness of 100 $\mu$m) capable of being treated by sand-blasting, pouring a liquid photo-sensitive resin (100% modulus of the resin photo-hardened = 500 kg/cm$^2$) into the area defined by the molding frame, exposing the resin to light through a film carrying pictures and/or patterns, developing the exposed resin to thus give a mask carrying the images which comprises photo-hardened photo-sensitive resin layer having through holes corresponding to the images, applying a rubber paste to the reverse face of the support and then adhering the resulting product to the surface of a material to be processed. In addition, J. P. KOKAI No. Sho 60-104939 discloses a transfer material for forming a mask for sand blasting which comprises a layer carrying a mask-pattern formed from a liquid photo-sensitive resin composition in which the molecular structure and the properties of its components are specified; a substrate layer for supporting the layer carrying the mask-pattern; and a support layer which is placed between the layer carrying the mask-pattern and the substrate layer, which can be well-adhered to the layer carrying the mask-pattern but is capable of being peeled off from the substrate layer and which can be destroyed through sand blasting. In the washing away development of these photo-sensitive resin compositions, it is necessary to use an organic solvent such as acetone or benzene; an alkaline aqueous solution such as an aqueous sodium hydroxide or sodium borate solution; an alcoholic solution of calcium chloride or an aqueous solution of a surfactant such as a neutral detergent as a developer.

The present invention has been completed under such circumstances and the object of the present invention is to provide a method for engraving or etching images with a mask carrying such images as well as a photo-sensitive laminate film for use in making a mask carrying images, which makes it possible to easily and precisely form fine precise images on a mask according to the photoprinting technique in the production of such a mask which is used when images are engraved or etched on the surface of a material to be processed such as glass, a metal or a plastic; which can be handled in the form of a film; which can easily be exposed to light and developed; which can be developed with a developer simply comprising water and whose handling is thus safe and economical; whose surface carrying images obtained after development has strong adhesion and thus can be adhered to the surface of a material to be processed without using any adhesive to thus transfer images to the material; whose substrate can easily be peeled off after fine pictures and/or patterns are transferred to the material to thus prevent the aberration of the position of an image; and which makes it possible to prevent the removal of fine portions of images during sand blasting to thus allow precise engraving and/or etching.

Disclosure of the Invention

The method for engraving and/or etching a material according to the present invention for achieving the foregoing object comprises the following steps (a) to (e): (a) a process for exposing, to light, a layer of a water-soluble resin composition of a photo-sensitive laminate film which comprises a supporting sheet, an image mask-protection layer peelablly adhered to the supporting sheet and a water-soluble resin composition layer having photocrosslinkability to thus cause crosslinking of the exposed areas of the resin layer to thereby form a predetermined pattern on the resin layer; (b) a process for dissolving out the non-crosslinked area on the layer of the water-soluble photo-sensitive resin composition by developing the layer with water to thus form a mask carrying the images which is constituted from the crosslinked areas of the photo-sensitive resin composition remaining on the image mask-protection layer; (c) a process for adhering the photo-sensitive laminate film on which the images are formed to the surface of a material to be processed; (d) a process for peeling off the supporting sheet from the photo-sensitive laminate film; and (e) a process for engraving and/or etching the material to be processed through the image-carrying mask adhered to the material. According to the foregoing processes, fine and precise images can be easily and precisely formed on a material to be processed through the photo-duplicating method. In addition, exposure and development processings are very simple since the photo-sensitive material is in the form of a film. Moreover, the development processing is safe and economical since it is performed with a developer simply comprising water. The surface of the image-carrying mask obtained after development exhibits strong adhesion and correspondingly the mask can be adhered to the material to be processed without using any adhesive. Further, the supporting sheet can easily be peeled off because of a presence of the image mask-protection layer after fine pictures and/or patterns are transferred to the material to thus prevent the aberration of the position of images and the removal of fine portions of the images can be prevented during sand blasting. Thus, the precise engraving and/or etching of a desired patterns and/or pictures can be performed.

In the method of the present invention, the treatment with water in the process (b) is preferably performed by previously immersing the photo-sensitive laminate film which has been exposed to light through a pattern to swell the non-crosslinked portion on the layer of the water-soluble resin composition and then washing with water. Thus, the non-crosslinked portion on the layer of the water-soluble resin composition can be completely removed and hence clear images can be obtained.

In the process (c), the photo-sensitive laminate film is preferably adhered to a material to be processed while applying a pressure or heating the same. Alternatively, the process (c) can be performed by applying, to the layer of the crosslinked water-soluble resin composition, an aqueous solution of sodium periodate, lithium chloride, lithium bromide, lithium nitrate, calcium chloride or ammonium thiocyanate to swell or solubilize the layer and then adhering the photo-sensitive laminate film to the material to be processed under pressure.

The process (e) for engraving or etching the material to be processed is preferably performed according to engraving or etching through sand blast. Likewise, the process (e) may be performed according to the engraving or etching with a chemical.

The photo-sensitive laminate film used in the method for engraving or etching a material to be processed comprises a supporting sheet, an image mask-protection layer peelablly adhered to the supporting sheet and a layer of a water-soluble resin composition having photocrosslinkability. The water-soluble resin composition having photocrosslinkability of the photo-sensitive laminate film for use in making an image carrying mask is a composition comprising a water soluble polymer and a photocrosslinking agent and preferably comprises a composition selected from the group consisting of a composition which comprises polyvinyl alcohol and a sulfate, hydrochloride, nitrate or phosphate of a condensate of 1-diazophenylamine with paraformaldehyde; a composition comprising polyvinyl pyrrolidone and sodium 4,4-bisazidostilbene-2,2'- disulfonate; and a composition comprising polyvinyl methyl ether and mono(-di)acryloxyethyl phosphate. The water-soluble resin composition having photocrosslinkability may be a composition comprising a water-soluble polymer having photocrosslinkable groups in the molecule selected from polyvinyl alcohol which is subjected to modification with acetal to introduce stilbazolium groups therein and polyvinyl alcohol to which N-methylolacrylamide is added. The layer of the water-soluble resin composition having photocrosslinkability preferably has a thickness ranging from 0.03 to 2 mm. If the thickness of the layer is limited to the range defined above, the image-mask obtained after development of the layer exhibits sufficient resistance to the sand blasting or etching with a chemical during the process for engraving or etching the material to be processed. The image mask-protection layer of the photosensitive laminate film for making an image-carrying mask is preferably prepared from a member selected from the group consisting of polyvinyl alcohol, polyvinyl alcohol derivatives, polyvinyl butyral, ethyl cellulose, cellulose acetate and cellulose nitrate. Moreover, the image mask-protection layer is made from a material different from that for the supporting sheet and may be obtained from a member selected from the group consisting of polyvinyl chloride, polystyrene and polyamide. If the material for forming the image mask-retention layer is limited to these specific ones, the image mask-protection layer is weakly adhered to the supporting sheet during the development processing and can easily be peeled off therefrom, while it is relatively strongly adhered to the layer of the water-soluble resin composition, i. e., to the image-carrying mask. The thickness of the image mask-protection layer preferably ranges from 1 to 30 $\mu$m. This is because, if the thickness thereof falls within the range defined above, the image-carrying mask can be supported by the layer without causing any breakage and the mask can easily be removed during the process for engraving and/or etching the material to be processed without any difficulty.

DESCRIPTION OF PREFERRED EMBODIMENTS

The preferred embodiments of the present invention will hereunder be explained in more detail, but the present invention is not restricted to these specific embodiments at all.

Figure 1:
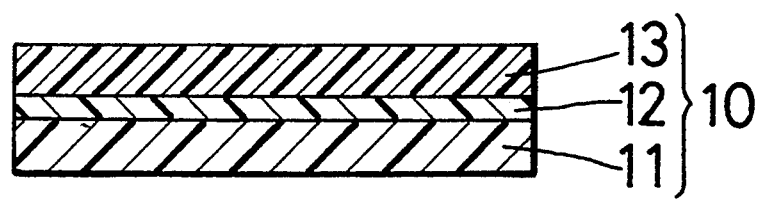
FIG. 1 is a cross-sectional view of the photosensitive laminate film for image-masks according to the present invention.

FIG. 1 shows the construction of the photo-sensitive laminate film for an image-carrying mask used in the method for engraving and/or etching a material with the use of such an image-carrying mask according to the present invention. In the photo-sensitive laminate film 10 for an image-carrying mask, an image mask-protection layer 12 is adhered to a supporting sheet 11 obtained from a polyester film having a thickness of 75 $\mu$m. The image mask-protection layer 12 comprises a layer of ethyl cellulose having a thickness of about 5 $\mu$m formed according to a coating technique. A layer 13 of a water-soluble resin composition having photocrosslinkability having a thickness of 80 $\mu$m is formed on the image mask-protection layer 12, the layer 13 being formed by coating a solution containing polyvinyl alcohol, an ethylene/vinyl acetate copolymer resin, a diazo resin, a water-dispersible pigment and a non-ionic surfactant, i.e., polyoxyethylene laurylphenyl ether and then drying the coated layer.

Figure 2:
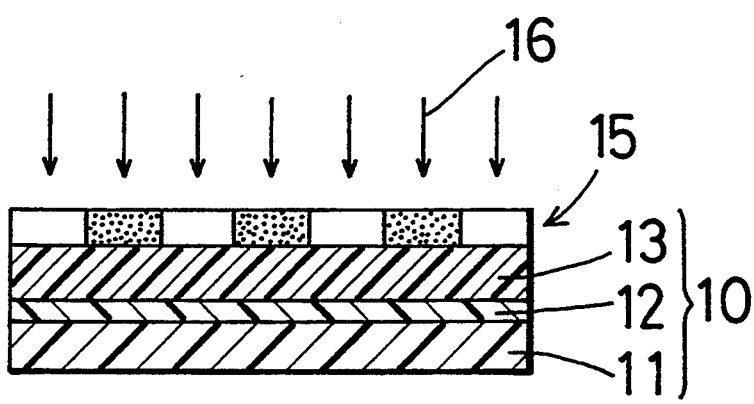
FIGS. 2 to 10 are diagrams for illustrating, in order, the method for engraving and/or etching with the aid of an image-carrying mask according to the present invention.
Figure 3:
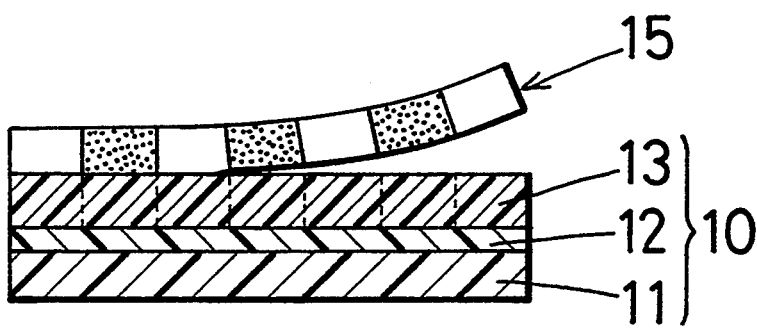
Figure 4:
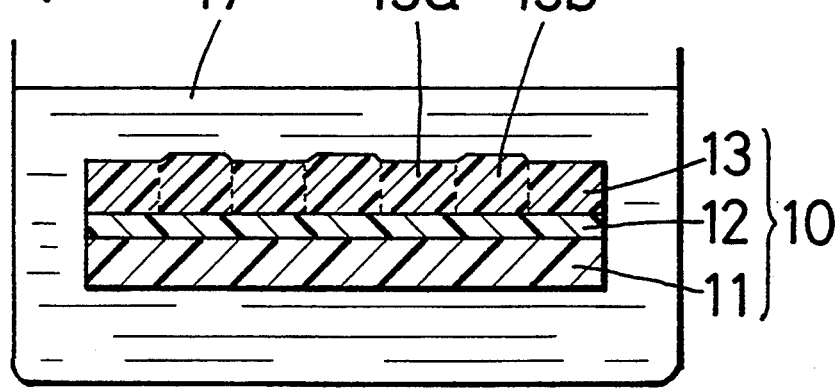
Figure 5:
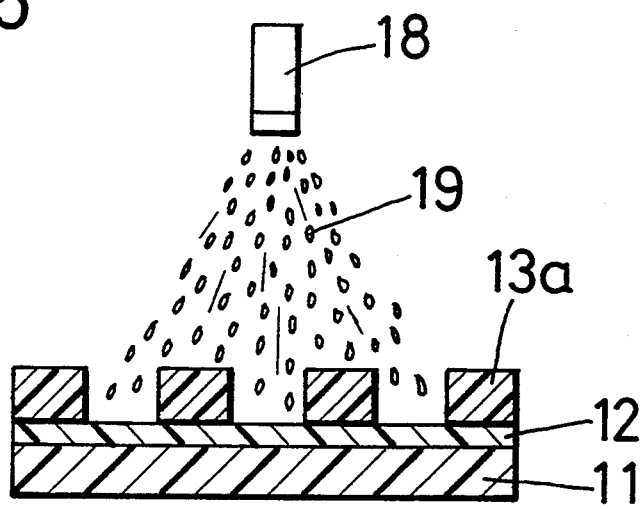

The method for engraving and/or etching a material with an image-carrying mask according to the present invention can be practiced with the aid of the photo-sensitive laminate film 10 for making an image-carrying mask in accordance with the processes as shown in the attached FIGS. 2 to 10. As is shown in FIG. 2, an original positive film 15 carrying fine pictures and patterns comes in close contact with the surface of the water-soluble resin composition-layer 13 of the photo-sensitive laminate film 10 and is irradiated with light 16 from a metal halide lamp. Then, as shown in FIG. 3, the original positive film 15 is peeled off from the photo-sensitive laminate film 10. If the exposed photo-sensitive laminate film 10 is immersed in water 17, the exposed portion thereof 13a is not swollen since it is crosslinked, but non-crosslinked unexposed portion 13b gets swollen and is soluble in water as shown in FIG. 4. As shown in FIG. 5, if water 19 is sprayed with a spraying device 18 to wash away the unexposed portion, only the exposed portion 13a remains as an image-carrying mask and the laminate film is thus developed. The resulting product is hot-air dried to give an image-carrying mask 13a on the image mask-protection layer 12 which is put on the supporting sheet 11.

Figure 6:
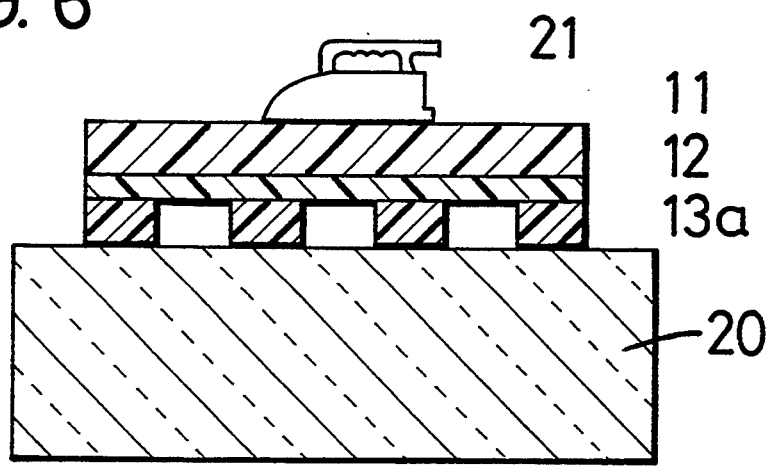
Figure 7:
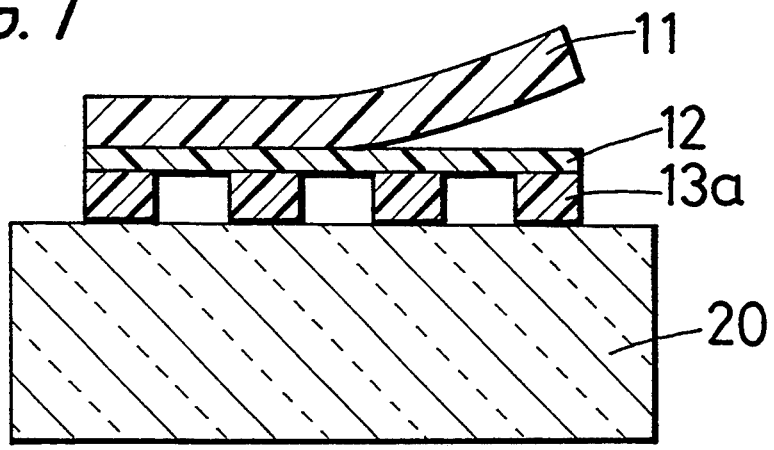
Figure 8:
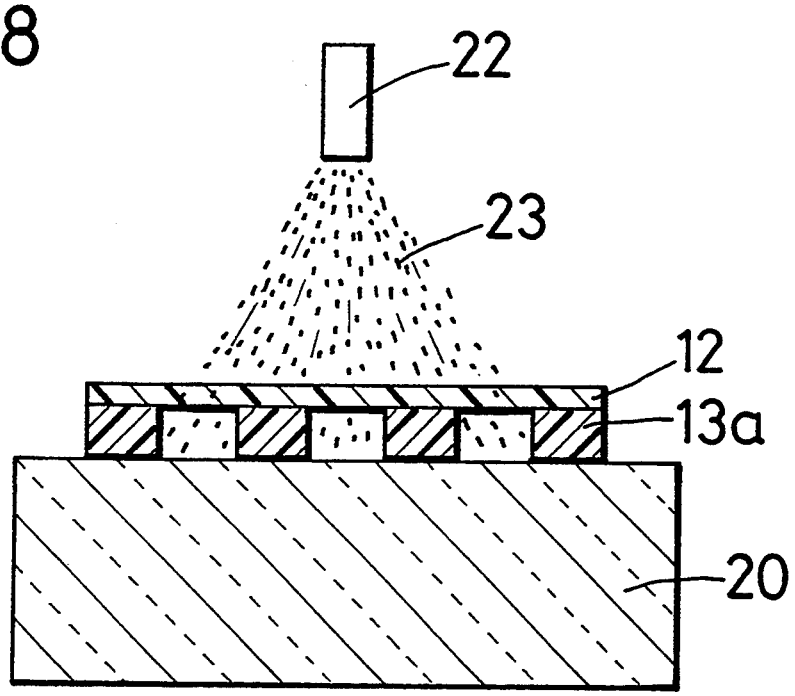
Figure 9:
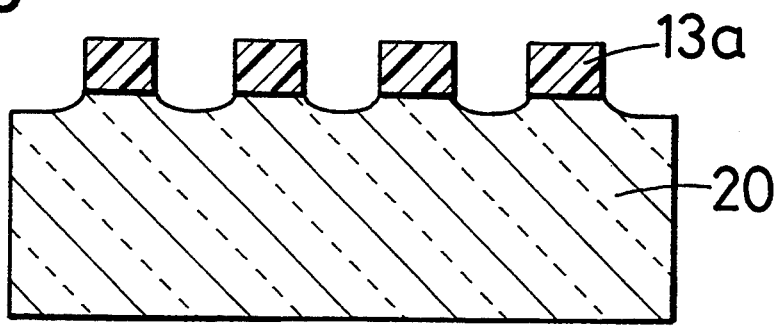
Figure 10:
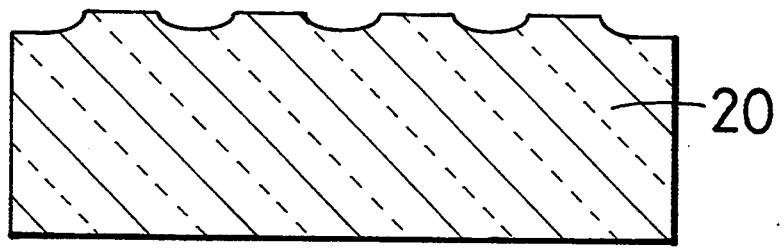

As is shown in FIG. 6, the image-carrying mask 13a which is still supported by the supporting sheet 11 and the image mask-protection layer 12 is adhered and contact-bonded to a glass plate 20 while heating with an iron 21. Then, as shown in FIG. 7, the supporting sheet 11 is peeled off from the image mask-protection layer 12. Further, as shown in FIG. 8, the glass plate is engraved or etched by blasting abrasive particles 23 through the image mask-protection layer 12 using a sand blasting machine 22. Thus, the portion of the glass plate 20 to which the image-carrying mask 13a is adhered is not engraved and/or etched, while on the portion of the glass plate to which the image-carrying mask 13a is not adhered or which is covered with only the image mask-protection layer 12 is engraved and/or etched, the image mask-protection layer 12 is completely removed and the surface of the glass plate 20 is engraved and etched as shown in FIG. 9. After the completion of the sand blasting operation, the remaining abrasive 23 and the image-carrying mask 13a are washed out so that the glass plate 20 on which the image is engraved or etched is completed as shown in FIG. 10.

The following variations can be made to the foregoing embodiment.

As the supporting sheet 11, there may be used, for instance, a polypropylene film, a polyethylene film, a polystyrene film, a polyvinyl chloride film, a polycarbonate film, synthetic paper or paper coated with a synthetic resin in addition to the polyester film used in the embodiment. Moreover, the thickness of the supporting sheet 11 may be adjusted within the range of from 50 to 500 $\mu$m.

In the foregoing embodiment, the layer 13 of the water-soluble resin composition used has a thickness of 80 $\mu$m. However, the thickness thereof may be varied between 0.03 to 2 mm and it is thus preferred to properly control the thickness thereof depending on the depth to be engraved and/or etched so that the image-carrying mask obtained after development shows proper resistance to sand blasting or chemicals. If the depth to be engraved is great, the thickness thereof should be adjusted within the range of from 0.1 to 2 mm so as to withstand the processing over a long time period, while if the depth to be engraved is small, it is sufficient to adjust the thickness to 30 to 80 $\mu$m.

In the foregoing embodiment, the exposure process shown in FIG. 2 is performed by irradiating with the light 16 from a metal halide lamp, but it is also possible to use other light sources which emit actinic rays having a wave length ranging from 300 to 500 nm such as an arc lamp, a xenon lamp or a high pressure mercury lamp.

The development processing as shown in FIG. 5 is carried out by spraying water 19 using a spraying machine 18, but it is also effective to lightly rub the surface with a brush or a sponge simultaneously with such a spraying operation to wash out the non-exposed portion and to thus develop the laminate film.

In the process shown in FIG. 8, the engraving or etching process is performed by blasting the abrasive particles 23 with the aid of the sandblasting machine 22, but the etching with a chemical is likewise effective. Examples of chemicals used in the engraving or etching treatment are an aqueous solution of hydrofluoric acid when the materials to be processed are glass and stones, an aqueous solution of ferric chloride when the materials are copper and copper alloys, and aqueous solutions of hydrochloric acid and sulfuric acid when they are other metals.

The present invention will hereunder be explained in more detail with reference to the following specific examples.

Example 1

15 parts by weight of polyvinyl alcohol having an average degree of polymerization of 1,700 and a degree of saponification of 88 mole % (available from Shin Etsu Chemical Co., Ltd. under the trade name of PA-18) was dissolved in 85 parts by weight of water. To the resulting solution, there were added 120 parts by weight of an ethylene-vinyl acetate copolymer emulsion having a solid content of 50% by weight (available from Showa Highpolymer Co., Ltd. under the trade name of EVA AD-50), 5 parts by weight of a diazo resin, 0.2 part by weight of a water-dispersible blue pigment and 1 part by weight of a non-ionic surfactant, i.e., polyoxyethylene laurylphenyl ether followed by mixing of these to give a mixed solution for forming a layer of a photo-sensitive resin composition. A polyester film having a thickness of 75 $\mu$m was provided as a supporting sheet. A solution obtained by dissolving ethyl cellulose ("Ethocell STD-10" available from Dow Chemical Co., Ltd.) in a 1:1 mixed solvent of ethyl alcohol and toluene so that the concentration of the ethyl cellulose was 10% by weight was applied onto the supporting sheet and then dried to give an image mask-protection layer having a thickness of about 5 $\mu$m (determined after drying). The mixed solution of the photo-sensitive resin composition prepared above was applied onto the image mask-retention layer and dried to give a photo-sensitive laminate film comprising a layer of the photo-sensitive resin composition having a thickness of 80 $\mu$m.

An image-carrying mask was prepared from the photo-sensitive laminate film thus prepared. An original positive film was closely put on the layer of the photo-sensitive resin composition of the photo-sensitive laminate film and the resulting assembly was exposed to light from a 3 KW metal halide lamp at a distance of 1 m. Then the exposed film was developed by immersing in water maintained at ordinary temperature for 3 minutes to let the film absorb water and to thus swell the same, then lightly rubbing with a sponge and washing out to retain only the exposed portion. The developed product was dried with hot air of 50° C. to give an image-carrying mask which carried fine pictures and/or patterns and which still was supported by the image mask-protection layer and the supporting sheet. There was not observed any separation between the supporting sheet and the image mask-protection layer and between the image mask-protection layer and the image-carrying mask during the development processing.

The image-carrying mask was adhered to a glass plate having a thickness of 8 mm and subjected to contact bonding while applying heat with an iron through the supporting sheet. Then the supporting sheet was peeled off from the image mask-protection layer- The supporting sheet was easily separated from the image mask-protection layer, but the adhesion between the image mask-protection layer and the image-carrying mask was strong and, therefore, there was not observed any aberration of the relative position between the image-carrying mask and the glass plate.

The assembly thus obtained which comprised the glass plate, the image-carrying mask directly adhered to the glass plate and the image mask-protection layer was fixed in a sandblasting machine and an abrasive, Alundum #80, was blasted on the glass plate through the image-carrying mask at a compressed-air pressure of 4 kg/cm$^2$ through a nozzle having a diameter of 3.6 mm at a distance of about 20 cm to thus perform engraving of the glass plate. The image-carrying mask was not peeled off and was not damaged at all and the surface of the glass plate to which the image-carrying mask had been adhered was not impaired even when the abrasive was blasted on the assembly for 30 seconds. On the other hand, when the abrasive was blasted on the assembly for 10 seconds, the image mask-protection layer was completely removed from the portion of the glass plate which was covered with only the image mask-protection layer and the glass surface was engraved to a depth of about 1 mm. After the completion of the sand blasting operation, the remaining image-carrying mask sufficiently got swollen with water and then washed away. Thus, the fine picture and patterns of the original were faithfully engraved on the glass plate.

Example 2

There was dissolved, in water, a stilbazolium-added polyvinyl alcohol which was prepared by subjecting, to a reaction with acetal, polyvinyl alcohol having an average degree of polymerization of 1,700 and degree of saponification of 88 mole % (available from Shin Etsu Chemical Co., Ltd. under the trade name of PA-18) to add 1.4 mole % of N-methyl-$\gamma$-(p-formylstilyl)-pyridinium methosulfate to thus give a solution having a concentration of 15% by weight. 15 parts by weight of an acrylate oligomer (available from Toagosei Chemical Industry Ltd. under the trade name of Aronix M-8030), 15 parts by weight of pentaerythritol triacrylate and 3 parts by weight of 2-chlorothioxanthone (available from Nippon Kayaku Co., Ltd. under the trade name of Kayacure CTX) were added to and dispersed in the foregoing solution. 55 parts by weight of a 50% by weight polyvinyl acetate emulsion and 0.2 part by weight of a water-dispersible purple pigment were added to and mixed with the resulting dispersion to thus prepare a mixed solution of a photo-sensitive resin composition. This mixed solution of the photo-sensitive resin composition was applied onto the surface of an image mask-protection layer applied to a supporting sheet similar to those used in Example 1 and then dried to give a photo-sensitive laminate film carrying a layer of the photo-sensitive resin composition having a thickness of 100 $\mu$m.

The same procedures used in Example 1 were repeated to give an image-carrying mask using the photo-sensitive laminate film. There was not observed any separation between the supporting sheet and the image mask-protection layer and between the image mask-protection layer and the layer of the photo-sensitive resin composition, i.e., the image-carrying mask during the development processing.

The image-carrying mask thus obtained which had been still carried by the supporting sheet and the image mask-protection layer was adhered to a glass plate having a thickness of 8 mm on which a 1% aqueous solution of sodium periodate was coated and subjected to contact bonding. Then the supporting sheet was peeled off from the image mask-protection layer. The supporting sheet was easily be separated from the image mask-protection layer, but the adhesion between the image mask-protection layer and the image-carrying mask was strong and, therefore, there was not observed any aberration of the relative position between the image-carrying mask and the glass plate.

A 50% by weight aqueous solution of hydrofluoric acid was applied onto the surface of the resulting assembly which comprised the glass plate, the image-carrying mask adhered to the glass plate and the image mask-protection layer on the image-carrying mask, on the side of the image mask-protection layer. After about 2 minutes, the assembly was sufficiently washed with water to wash out the aqueous hydrofluoric acid solution as well as the remaining image-carrying mask. The portion of the glass plate to which the image-carrying mask had been adhered was not corroded with the hydrofluoric acid aqueous solution. On the other hand, the image mask-protection layer was approximately easily removed and the portion of the glass plate to which any image-carrying mask had not been adhered, i.e., that covered with only the image mask-protection layer was corroded and dissolved out to a depth of about 50 μm. Thus, the fine picture and patterns of the original were faithfully etched on the glass plate.

Industrial Applicability

According to the method for engraving and/or etching according to the present invention, fine and precise images can be engraved and/or etched on the surface of a material to be processed such as glass, metals and plastics. The Photo-sensitive laminate film for making an image-carrying mask used in the engraving and/or etching method can be handled in the form of a film during preparing the image-carrying mask and thus the handling thereof during the exposure to light and the development is very simple. In addition, since the development thereof can be performed with a developer simply comprising water, the film is safe and economical. The image-carrying mask obtained after development can be adhered to a material to be processed without using any adhesive since the surface thereof has adherence and does not cause the aberration of the position relative to the material to be processed even if it carries fine pictures and patterns because of a presence of the image mask-protection layer. Moreover, the image mask-protection layer serves to prevent the separation of fine portions of the image during the sand blasting operation and as a result, precise engraving can be performed.

We claim:

1. A photo-sensitive laminate film for use in making an image-carrying mask for engraving or etching an image on a substrate comprising
    a supporting sheet,
    a water-insoluble image mask-protection layer peelably adhered to said supporting sheet, and
    a solid layer of a water-soluble resin composition having photocrosslinkability applied onto said image mask-protection layer, said water-soluble resin composition comprising an acetal-modified polyvinyl alcohol having stilbazolium groups introduced therein, said image mask-protection layer being removable from said solid layer by engraving or etching before said solid layer is removed from the substrate on which said solid layer is placed during use of the photo-sensitive laminate film to form an image by engraving or etching.

2. The photo-sensitive laminate film for use in making an image-carrying mask of claim 1 wherein the layer of the water-soluble resin composition having photocrosslinkability has a thickness ranging from 0.04 to 2 mm.

3. The photo-sensitive laminate film for use in making an image-carrying mask of claim 1 wherein the image mask-protection layer is prepared from a member selected from the group consisting of polyvinyl alcohol, polyvinyl alcohol derivatives, polyvinyl butyral, ethyl cellulose, cellulose acetate and cellulose nitrate and the thickness of the image mask-protection layer ranges from 1 to 30 μm.

4. The photo-sensitive laminate film for use in making an image-carrying mask of claim 1 wherein the image mask-protection layer is prepared from a material different from that for the supporting sheet and is obtained from a member selected from the group consisting of polyvinyl chloride, polystyrene and polyamide and the thickness of the image mask-protection layer ranges from 1 to 30 μm.

* * * * *

UNITED STATES PATENT AND TRADEMARK OFFICE
CERTIFICATE OF CORRECTION

PATENT NO. : B1 5,427,890
DATED : February 1, 2000
INVENTOR(S) : Tsutomu Suzuki, et al It is certified that error appears in the above-identified patent and that said Letters Patent is hereby corrected as shown below:

Column 2,
Line 6, after "sheet," insert ---- wherein said image mask-protection layer is prepared from a member selected from the group consisting of polyvinyl alcohol, polyvinyl alcohol derivatives, polyvinyl butyral, ethyl cellulose, cellulose acetate and cellulose nitrate ----.

Signed and Sealed this

Twenty-first Day of August, 2001

Attest:

NICHOLAS P. GODICI
*Attesting Officer*   *Acting Director of the United States Patent and Trademark Office*

REEXAMINATION CERTIFICATE (3988th)

United States Patent [19]
Suzuki et al.

[11] B1 5,427,890
[45] Certificate Issued Feb. 1, 2000

[54] PHOTO-SENSITIVE LAMINATE FILM FOR USE IN MAKING THE MASK COMPRISING A SUPPORTING SHEET, AN IMAGE MASK PROTECTION LAYER WHICH IS WATER INSOLUBLE AND A WATER SOLUBLE MASK FORMING COMPOSITION

[75] Inventors: Tsutomu Suzuki; Ikuo Suzuki, both of Toyohashi, Japan

[73] Assignee: Aicello North America, Inc., North Vancouver, Canada

Reexamination Request:
No. 90/005,065, Aug. 12, 1998

Reexamination Certificate for:
Patent No.: 5,427,890
Issued: Jun. 27, 1995
Appl. No.: 08/116,277
Filed: Sep. 3, 1993

[22] PCT Filed: Oct. 22, 1990
[86] PCT No.: PCT/JP90/01360
§ 371 Date: Mar. 28, 1991
§ 102(e) Date: Mar. 28, 1991

Related U.S. Application Data

[63] Continuation of application No. 07/668,520, Mar. 28, 1991, abandoned.

[51] Int. Cl.[7] .............................. G03C 1/805; G03C 1/91; G03F 7/021; G03F 7/012
[52] U.S. Cl. ..................... 430/263; 430/160; 430/167; 430/262; 430/271.1; 430/286.1; 430/287.1; 430/909
[58] Field of Search ................................ 430/271.1, 262, 430/263

[56] References Cited

U.S. PATENT DOCUMENTS

| | | | |
|---|---|---|---|
| 4,430,416 | 2/1984 | Goto et al. ............................. | 430/263 |
| 4,764,449 | 8/1988 | Vaniseghem ............................ | 430/162 |
| 5,260,173 | 11/1993 | Birkholm et al. ...................... | 430/325 |

FOREIGN PATENT DOCUMENTS

| | | |
|---|---|---|
| 59-154442 | 9/1984 | Japan . |
| 61-186955 | 8/1986 | Japan . |

OTHER PUBLICATIONS

East Shore Chemicals Brochure, N–methyl–4–(p–formyl styryl) pyridine methosulfate substituted polyvinyl alcohol, Nov. 1984.

*Primary Examiner*—John S. Chu

[57] ABSTRACT

A method for engraving and/or etching comprising the steps of: (a) a process for exposing, to light, a layer of a water-soluble resin composition of a laminated photo-sensitive film which comprises a supporting sheet, a image mask-protection layer peelablly adhered to the supporting sheet and a layer of a water-soluble resin composition having photocrosslinkability to thus cause crosslinking of the exposed area of the resin layer to thereby form a predetermined pattern on the resin layer; (b) a process for dissolving out the non-crosslinked portion of the layer of the water-soluble photo-sensitive resin composition by developing the layer with water to thus from an image-carrying mask which is constituted from the crosslinked area of the photo-sensitive resin composition remaining on the image mask-protection layer; (c) a process for adhering the photo-sensitive laminate film on which the images are formed to the surface of a material to be processed; (d) a process for peeling off the supporting sheet from the photo-sensitive laminate film; and (e) a process for engraving and/or etching the material to be processed through the image-carrying mask adhered to the material, makes it possible to engrave and/or etch fine and precises images on the surface of a material to be processed such as glass, metals, plastics or the like.

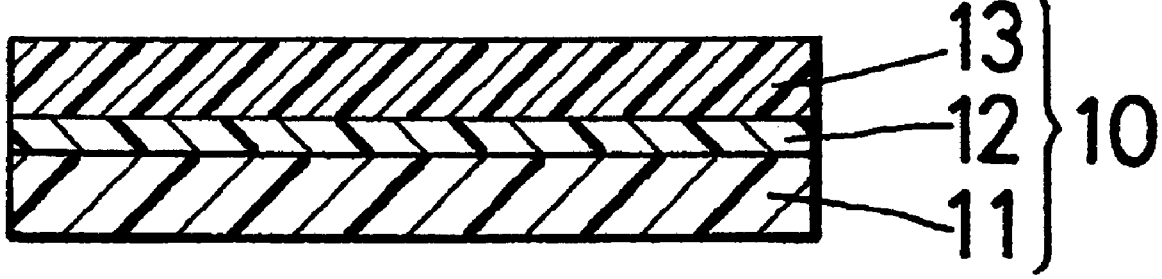

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2 and 4 are cancelled.

Claim 1 is determined to be patentable as amended.

Claim 3, dependent on an amended claim, is determined to be patentable.

1. A photo-sensitive laminate film for use in making an image-carrying mask for engraving or etching an image on a substrate comprising a supporting sheet, a water-insoluble image mask-protection layer peelably adhered to said supporting sheet, and a solid layer of a water-soluble resin composition having photocrosslinkability applied onto said image mask-protection layer, said water-soluble resin composition comprising an acetal-modified polyvinyl alcohol having stilbazolium groups introduced therein, said image-protection layer being removable from said solid layer by engraving or etching before said solid layer is removed from the substrate on which said solid layer is placed during use of the photo-sensitive laminate film to form an image by engraving or etching, *wherein the layer of the water-soluble resin composition having photocrosslinkability has a thickness ranging from 0.04 to 2 mm.*

* * * * *